United States Patent [19]
Hayashi et al.

[11] Patent Number: 5,627,781
[45] Date of Patent: May 6, 1997

[54] NONVOLATILE SEMICONDUCTOR MEMORY

[75] Inventors: Yutaka Hayashi; Machio Yamagishi, both of Kanagawa, Japan

[73] Assignee: Sony Corporation, Tokyo, Japan

[21] Appl. No.: 555,144

[22] Filed: Nov. 8, 1995

[30] Foreign Application Priority Data

Nov. 11, 1994 [JP] Japan ..................... 6-277725
Mar. 20, 1995 [JP] Japan ..................... 7-061166

[51] Int. Cl.$^6$ .................. G11C 7/00; G11C 8/00
[52] U.S. Cl. .................. 365/185.2; 365/185.03; 365/189.07; 365/210
[58] Field of Search .................. 365/189.07, 185.03, 365/185.2, 207, 210

[56] References Cited

U.S. PATENT DOCUMENTS

| | | | |
|---|---|---|---|
| 4,964,079 | 10/1990 | Devin | 365/185.2 X |
| 5,025,417 | 6/1991 | Miyamoto et al. | 365/185.2 X |
| 5,148,063 | 9/1992 | Hotta | 307/530 |
| 5,386,388 | 1/1995 | Atwood et al. | 365/201 |
| 5,446,686 | 8/1995 | Bosnyak et al. | 365/210 X |
| 5,461,713 | 10/1995 | Pascucci | 365/210 X |

FOREIGN PATENT DOCUMENTS

| | | |
|---|---|---|
| 0122564 | 10/1984 | European Pat. Off. . |
| 629494 | 1/1994 | Japan . |
| 90/12400 | 10/1990 | WIPO . |

OTHER PUBLICATIONS

Nakai et al., "A 36ns 1Mbit CMOS EPROM with new data sensing technique", Sep. 1990 Symposium on VLSI Circuits.

*Primary Examiner*—Do Hyun Yoo
*Attorney, Agent, or Firm*—Hill, Steadman & Simpson

[57] ABSTRACT

A rewritable nonvolatile semiconductor memory device having a plurality of memory cells which are electrically and reversably variable in threshold values and one pair of reference cells, provided for each predetermined number of memory cells, having the same cross-sectional structure as the memory cells, the pair of reference cells having written in them data of opposite phases, and, at the time of reading, the currents of the pair of reference cells being combined to produce a reference current and the data being determined by comparing this with the signal current of the memory cell.

7 Claims, 10 Drawing Sheets

NONVOLATILE SEMICONDUCTOR MEMORY

BACKGROUND OF THE INVENTION

1. Field of the Invention

The present invention relates to a rewritable nonvolatile semiconductor memory device, more particularly relates to a nonvolatile semiconductor memory device which can substantively improve the memory retention, the number of rewrites, and the yield of a nonvolatile memory having a small window.

2. Description of the Related Art

In a nonvolatile semiconductor memory device, use has been made of a differential amplifier to read the data of the transistor constituting the selected memory cell. In the differential amplifier, the potential signal data or current signal data (hereinafter also referred to generically as the "signal data") from the selected memory cell is compared with the reference potential or reference current (hereinafter also referred to generically as the "reference data") to determine if the signal data is "0" or "1". For example, when the signal data is smaller than the reference data, it is decided that the signal data is the data "0", and in the reverse case, it is decided that it is the data "1".

In one example of the method of preparation of the reference data, a reference cell having the same circuit configuration as the memory cell is sometimes used.

However, in a conventional nonvolatile semiconductor memory device, as shown in FIG. 1, a threshold value voltage Vth0 of the memory cell in which the data "0" (off at the time of reading) is stored sometimes becomes low along with the elapse of time (abscissa of graph, logt) due to the deterioration of the rewriting characteristic of the transistor, the deterioration of retention of the memory, manufacturing variations, etc. In this case, there is a concern that it will become lower than the gate voltage Vr at the time of reading of the data and a malfunction will occur. Note that, in FIG. 1, $V_{th1}$ indicates the change of the voltage of the threshold value of the memory cell in which the data "1" (on at the time of reading) is stored.

Examining this state for the current from the memory cell, the result becomes as shown in FIG. 2. A current $i_0$ read from the memory cell in which the data "0" is stored increases along with the elapse of time. Note that, the current $i_1$ read from the memory cell in which the data "1" is stored is substantially constant regardless of the elapse of time in the case of this example. This is because, where the transistor constituting the memory cell is a transistor having a floating gate, electrons are not injected into the floating gate of the memory cell in which the data "1" is stored.

On the other hand, as the reference cell for preparing the reference data, conventionally a transistor which becomes ON at the time of reading (in which the data "1" is stored) is used and is set so that the reference current $i_{rp}$ at the time of reading becomes the predetermined rate of $i_1$, for example, about ¼, and therefore even if $i_1$ changes along with the elapse of time, the reference current $i_{rp}$ changes by the constant rate of $i_1$, and therefore at the time of the detection of the data "1", a malfunction is avoided. On the other hand, when the current $i_0$ read from the memory cell in which the data "0" is stored starts to change and then exceeds the reference current $i_{rp}$ at a certain point of time, there is a danger of a malfunction.

In recent years, along with the reduction of voltages, the difference between the data "1" and the data "0" at the time of reading (difference between $i_1$ and $i_0$ or difference between $V_{th1}$ and $V_{th0}$) has become smaller (window is small). In such a memory, in particular, improvement of the memory retention, the number of rewrites, and the yield has been desired.

SUMMARY OF THE INVENTION

The present invention was made in consideration with such an actual circumstance and has as an object thereof to provide a nonvolatile semiconductor memory device which can improve the memory retention, the number of rewrites, and the yield of particularly a nonvolatile memory having a small window.

So as to achieve the above-described object, nonvolatile semiconductor memory device according to the present invention has a plurality of memory cells having transistors which are able to change in the amount of storage of charges or invert in polarity; reference cells having transistors which have a construction in the direction of thickness roughly the same as that in the direction of thickness of the transistors constituting the memory cells and provided in at least one pair for every predetermined number of memory cells; a driving means for writing for also driving the corresponding reference cells when driving a selected memory cell and writing the data "1" in one reference cell and writing the data "0" in the other reference cell at the time of writing in the memory cell; a driving means for reading for reading the data of the corresponding pair of reference cells when reading the data of the selected memory cell; a reference data production means for combining the data ($i_1$, $i_0$) of one pair of the reference cells selected for reading based on the following Equation (1) and preparing a k-multiple of the reference data ($i_{re}$) or the reference data ($i_{re}$); and a comparison means for determining the data stored in a selected memory cell by comparing the k-multiple of the reference data ($i_{re}$) or the reference data ($r_{re}$) combined by the combining means with the signal data from the selected memory cell or the k-multiple of the signal data.

$$i_{re}=(m\times i_1+n\times i_0)/k \tag{1}$$

where, m, n, and k are positive numbers, and both of m and n are smaller than k.

The predetermined number of memory cells and pair of reference cells can be simultaneously driven by connecting them by an identical word line. Note, if they can be driven at almost the same time, it is not always necessary to connect them by an identical word line.

The memory cell and reference cell are not particularly restricted so far as they are comprised of a transistor having a function of holding data by a change of the amount of storage of charges or the inversion of the polarity and can be constituted by for example a transistor having a floating gate which can store a charge, a transistor having an insulating film having a charge trapping function, or a transistor having a strong dielectric film.

Note that, in the present invention, the sentence "compare the reference data found by the above-described Equation (1) with the signal data from the selected memory cell" may be consequently such a comparison. A comparison performed in a manner such that $m\times i_1+n\times i_0$ is defined as temporary reference data and that temporary reference data is compared with one obtained by multiplying the signal data from the selected memory cell by k is also the comparison in the present invention.

In the present invention, the memory device can also be constituted so that the reference data production means and the comparison means are integrally formed and so that the transistor constituting a part of the reference data production means acts also as the transistor of a part of a differential amplifier constituting the comparison means.

In this case, in the present invention, preferably the memory device has at least a first current-to-voltage conversion transistor which converts a signal current to a voltage, wherein the output lines of the pair of reference cells are joined and connected at the signal current of a joined interconnection; a first transistor for a differential amplifier to which the output line of the first current-to-voltage conversion transistor is connected and which constitutes a transistor of a part of conversion transistor which converts to a voltage the signal current of the output line of the memory cell; and a second transistor for the differential amplifier to which the output line of the second current-to-voltage conversion transistor is connected and which constitutes a transistor of a part of the differential amplifier; wherein the mutual relationship among values obtained by dividing the channel widths in these first current-to-voltage conversion transistor, second current-to-voltage conversion transistor, first transistor for a differential amplifier, and second transistor for a differential amplifier by the channel lengths is set to a predetermined ratio.

Also, in the present invention, it is possible that the memory device has at least a first coefficient multiple conversion circuit for multiplying the signal current of one output line of the reference cell by m or m/k; a second coefficient multiple conversion circuit for multiplying the signal current of the other output line of the reference cell by n or n/k; a joined interconnection circuit which joins the output line of the first coefficient multiple conversion circuit and the output line of the second coefficient multiple conversion circuit; a first current-to-voltage conversion transistor which converts to a voltage the current flowing through the joined interconnection; a first transistor for a differential amplifier to which the output line of the first current-to-voltage conversion transistor is connected and which constitutes a transistor of a part of the differential amplifier; a third coefficient multiple conversion circuit which multiplies the signal current of the output line of the memory cell by k or l; a second current-to-voltage conversion transistor which converts to a voltage the signal current of the output line of the third coefficient multiple conversion circuit; a second transistor for a differential amplifier to which the output line of the second current-to-voltage conversion transistor is connected and which constitutes a transistor of a part of the differential amplifier; wherein a mutual relationship among values obtained by dividing the channel widths in the transistor of the first coefficient multiple conversion circuit, the transistor of the second coefficient multiple conversion circuit, the transistor of the third coefficient multiple conversion circuit, the first current-to-voltage conversion transistor, the second current-to-voltage conversion transistor, the first transistor for a differential amplifier, and the second transistor for a differential amplifier by the channel lengths is set to a predetermined ratio.

Also, in the present invention, it is possible if the memory device has at least a first coefficient multiple conversion circuit for multiplying the signal current of one output line of the reference cell by m or m/k; a second coefficient multiple conversion circuit for multiplying the signal current of the other output line of the reference cell by n or n/k; a joined interconnection circuit which joins the output line of the first coefficient multiple conversion circuit and the output line of the second coefficient multiple conversion circuit; a first current-to-voltage conversion transistor which converts to a voltage the current flowing through the joined interconnection; a first transistor for a differential amplifier to which the output line of the first current-to-voltage conversion transistor is connected and which constitutes a transistor of a part of the differential amplifier; a second current-to-voltage conversion transistor which converts to a voltage the signal current of the output line of the memory cell; and a second transistor for a differential amplifier to which the output line of the second current-to-voltage conversion transistor is connected and which constitutes a transistor of a part of the differential amplifier; wherein a mutual relationship among values obtained by dividing the channel widths in the transistor of the first coefficient multiple conversion circuit, the transistor of the second coefficient multiple conversion circuit, the first current-to-voltage conversion transistor, the second current-to-voltage conversion transistor, the first transistor for a differential amplifier, and the second transistor for a differential amplifier by the channel lengths is set to a predetermined ratio.

In the present invention, preferably the voltage conversion operations of the first current-to-voltage conversion transistor and second current-to-voltage conversion transistor are stabilized and, at the same time, a transistor for setting an initial state of the differential amplifier is added.

BRIEF DESCRIPTION OF THE DRAWINGS

These and other objects and features of the present invention will become clearer from the following description of the preferred embodiments made in reference to the attached drawings, in which.

DESCRIPTION OF THE PREFERRED EMBODIMENTS

Figure 1:
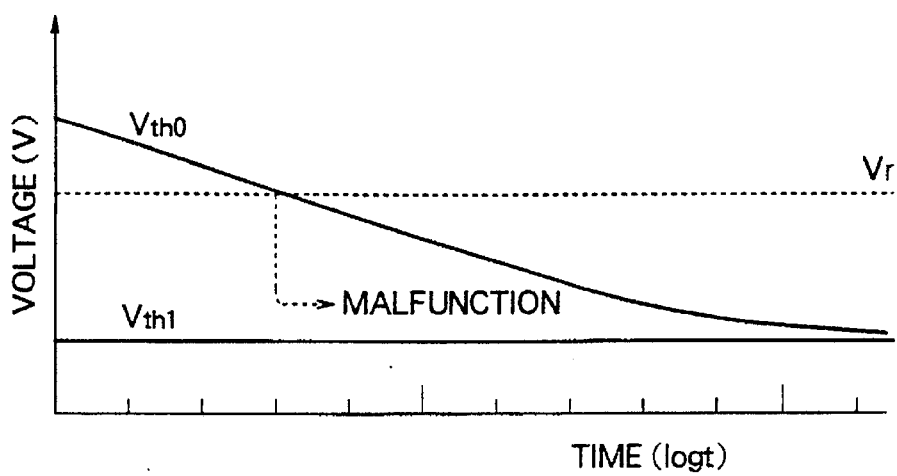
FIG. 1 is a graph showing a change of the memory cell according to a conventional example along with the elapse of time.

Below, a nonvolatile semiconductor memory device according to the present invention will be explained in detail based on embodiments shown in the drawings.

Figure 3:
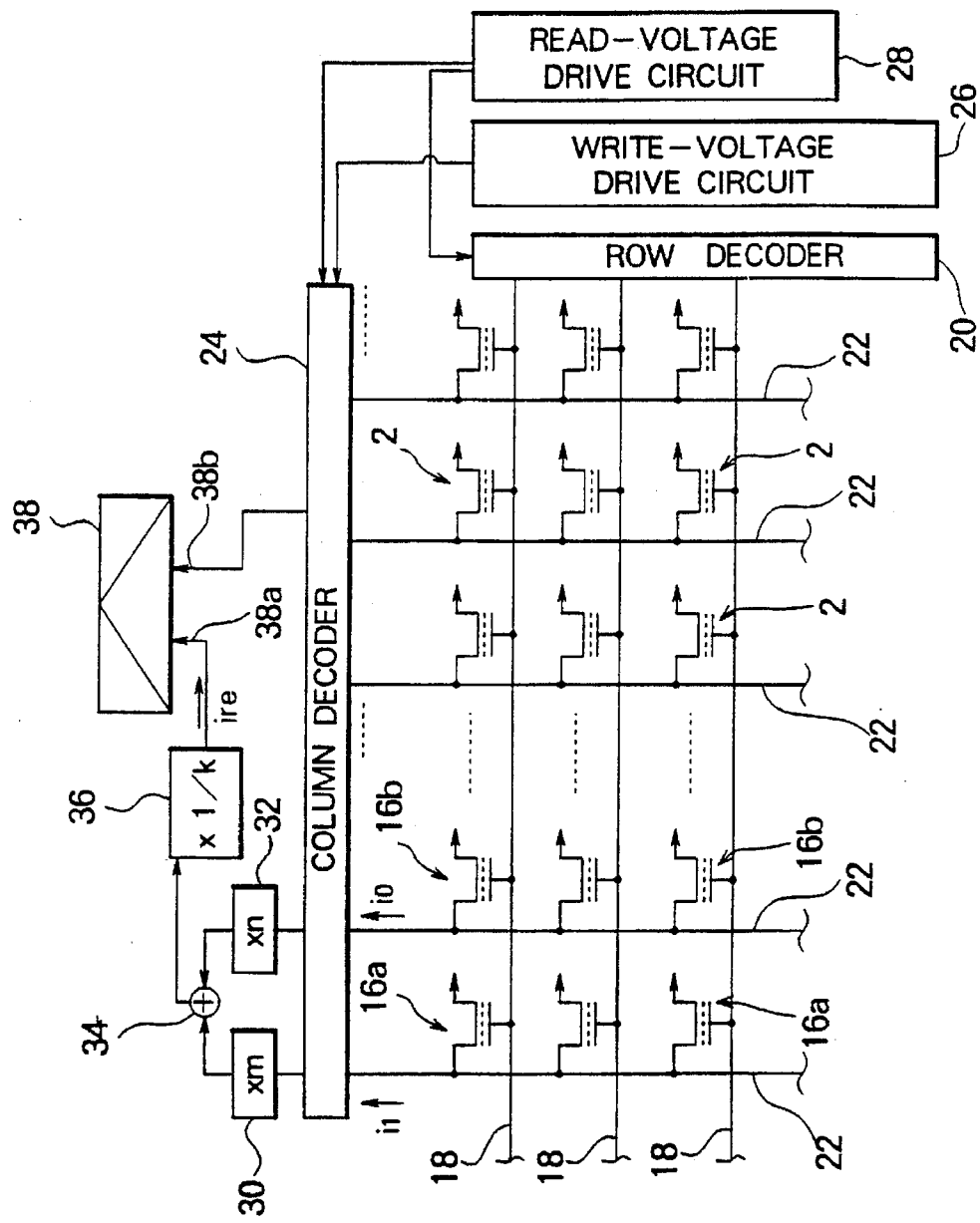
FIG. 3 is a schematic view of the configuration of a nonvolatile semiconductor memory device according to one embodiment of the present invention.

FIG. 3 is a schematic view of the configuration of a nonvolatile semiconductor memory device according to a first embodiment of the present invention.

Figure 4:
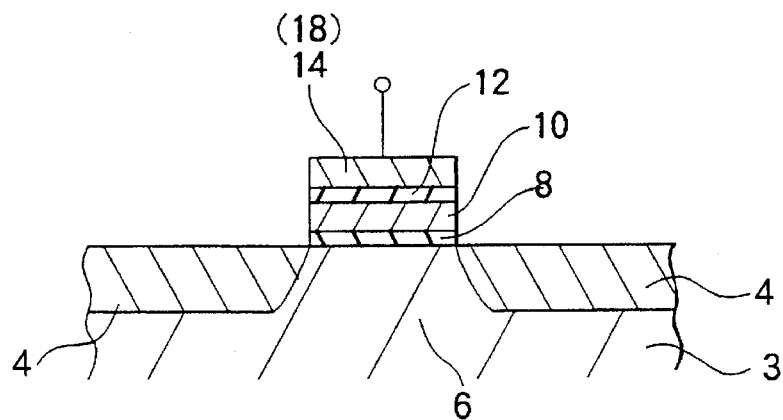
FIG. 4 is a cross-sectional view of a principal part of the memory cell according to a first embodiment of the present invention.

As shown in FIG. 3, the nonvolatile semiconductor memory device of the present embodiment is a NOR type memory wherein the memory cells 2 are arranged in the form of a matrix. Each memory cell 2 is constituted by a transistor having a floating gate in the present embodiment. In a transistor having a floating gate, as shown in FIG. 4, a floating gate 10, an intermediate insulating film 12, and a control gate 14 are superposed on a channel 6 between the source and drain regions 4 and 4 formed in a surface region or well of a semiconductor substrate 3 via a gate insulating film 8. In this transistor, by controlling the voltage which is applied to the control gate 14 (word line) and the source and drain regions 4 and 4 (bit line and source), electrons are injected or drawn to or from the floating gate 10 by utilizing an FN effect, etc., whereby the threshold value voltage of the transistor can be changed and the erasing of storage of data can be carried out.

As the semiconductor substrate 3, when for example a P-type single crystal silicon wafer is used, if an N-type single crystal silicon wafer is used in the surface region thereof, a transistor 2 for a memory cell is formed in the P-type well formed on the surface thereof. The source and drain regions 4 and 4 are for example N-type impurity regions and formed by performing the ion implantation after the preparation of the floating gate 10 and the control gate 14. It is also possible for the source and drain regions 4 and 4 to have an LDD construction. The gate insulating film 8 is constituted by for example a silicon oxide film having a thickness of about 8 nm. The floating gate 10 is constituted by for example a polycrystalline silicon layer. Note that although the illustration is omitted, the side surface of the floating gate 10 is covered by an insulative side wall. An intermediate insulating film 12 is constituted by for example a silicon oxide film or an ONO film (superposed films of a silicon oxide film, silicon nitride film, and silicon oxide film), etc., and the film thickness thereof is 14 nm in for example the silicon oxide film conversion. The control gate 14 is constituted by for example a polycrystalline silicon film or polysilicide film (superposed films of a polycrystalline silicon film and silicide film), etc.

As shown in FIG. 3, in the first embodiment, a pair of reference cells 16a and 16b are arranged for every memory cell 2 of each row. They can be simultaneously driven by an identical word line 18. The memory cell 2 and the reference cells 16a and 16b are constituted by transistors having schematically the same construction in the direction of thickness. The identical construction in the direction of thickness means that, where the transistors constituting the memory cell 2 are transistors of a type having a floating gate 10 with the construction shown in FIG. 4, the transistors constituting the reference cells 16a and 16b will also have a similar construction and thickness. The channel length, channel width, etc. of the transistors may differ.

The word line 18 is connected to the row decoder 20. The drain regions of the transistor of the memory cell 2 and the transistors of the reference cells 16a and 16b are connected to the column decoder 24 through the bit line 22.

The row decoder 20 and the column decoder 24 have connected to them a writing voltage driving circuit 26 and a reading voltage driving circuit 28. The voltage set by these driving circuits 26 and 28 is applied through the word line 18 selected by the row decoder 20 and the bit line 22 selected by the column decoder 24 to a specific memory cell 2 and the reference cells 16a and 16b to carry out the writing and erasure of the data.

The bit lines 22 of the reference cells 16a and 16b have connected to them, via the column decoder 24 or directly, conversion circuits 30 and 32 multiplying the current values detected from the bit lines 22 by m or n, respectively. The outputs of the conversion circuits 30 and 32 are connected to a plus circuit 34 where they are added. Note that, as the plus circuit, it is sometimes possible just to connect the interconnections when just adding the currents. The output of the plus circuit 34 is connected to the conversion circuit 36, where the output of the plus circuit is multiplied by 1/k. The reference data production means is constituted by the conversion circuits 30, 32, and 36 and the plus circuit 34.

The output of the conversion circuit 36 is connected to one first input terminal 38a of the differential amplifier 38 serving as the comparison means. To the other second input terminal 38b of the differential amplifier 38 is input the data (current in the present embodiment) which has been stored in the memory cell 2 which was selected at the time of the reading through the bit line 22 selected by the column decoder 24. Note that, the conversion circuit 36, the differential amplifier 38, and the conversion circuits 30 and 32 can be formed integrally.

To erase the data stored in the memory cell 2 and the reference cells 16a and 16b, as shown in the following Table 1, it is sufficient to apply a voltage to the word line 18, the bit line 22, the source, and the substrate.

TABLE 1

Floating Gate Type Nonvolatile Memory
(NOR Type, Nondivided Source Line)

|  | Word line | Bit line | Substrate or well |
| --- | --- | --- | --- |
| Erasing | 18 to 20 V | 0 V | 0 V |
| Writing 1 | −8 V | 5 V | 0 V |
| Writing 0 | −8 V | 0 V | 0 V |
| Reading | 1.5 to 3 V | ≈1 V | 0 V |

To write the data "1" in a specific memory cell 2 which is selected by the row decoder 20 and the column decoder 24 shown in FIG. 3, a voltage shown in the above-described Table 1 is applied from the writing voltage driving circuit 26 to the word line 18 and the bit line 22 of the specific memory cell 2. In the first embodiment, the writing of the data "1" means that a current state is changed to a state where the electrons are discharged from the floating gate.

In the first embodiment, simultaneously with the writing of the data "1" to the specific memory cell 2, a pair of reference cells 16a and 16b connected by the same word line 18 as that for the specific memory cell 2 are simultaneously driven, the data "1" is written in one reference cell 16a, and the data "0" is written in the other reference cell 16b. The state of the voltage at the time of the writing of the data "0" is also shown in the above-described Table 1.

To write the data "0" in a specific memory cell 2 which is selected by the row decoder 20 and the column decoder 24 shown in FIG. 3, a voltage shown in the above-described Table 1 is applied from the writing voltage driving circuit 26 to the word line 18 and the bit line 22 of the specific memory cell 2. In the first embodiment, the writing of the data "0" means that the current state is changed to a state where the electrons are injected into the floating gate.

In the first embodiment, simultaneously with the writing of the data "0" to the specific memory cell 2, a pair of reference cells 16a and 16b connected by the same word line 18 as that for the specific memory cell 2 are simultaneously driven, the data "1" is written in one reference cell 16a, and the data "0" is written in the other reference cell 16b.

At the time of the reading of the data from a specific memory cell 2 which is selected by the row decoder 20 and the column decoder 24 shown in FIG. 3, a voltage shown in the above-described Table 1 is applied from the reading voltage driving circuit 28 to the word line 18 and the bit line 22 of the specific memory cell 2.

In the present embodiment, simultaneously with the reading of the data from the specific memory cell 2, the data is simultaneously read also from the pair of reference cells 16a and 16b connected by the same word line 18 as that for the specific memory cell 2. The data current read from the selected memory cell 2 is input to the second input terminal of the differential amplifier 38 through the bit line 22 and the column decoder 24. The data current $i_1$ read from one reference cell 16a is input to the first input terminal 38a of the differential amplifier 38 through the conversion circuit 30, the plus circuit 34, and the conversion circuit 36. The data current $i_0$ read from the other reference cell 16b is input to the first input terminal 38a of the differential amplifier 38 through the conversion circuit 32, the plus circuit 34, and the conversion circuit 36. Namely, the reference current $i_{rs}$ to be input to the first input terminal of the differential amplifier 38 can be expressed by the following Equation (1).

$$i_{re} = (m \times i_1 + n \times i_0)/k \qquad (1)$$

where, m, n, and k are positive numbers, and both of m and n are smaller than k.

Figure 2:
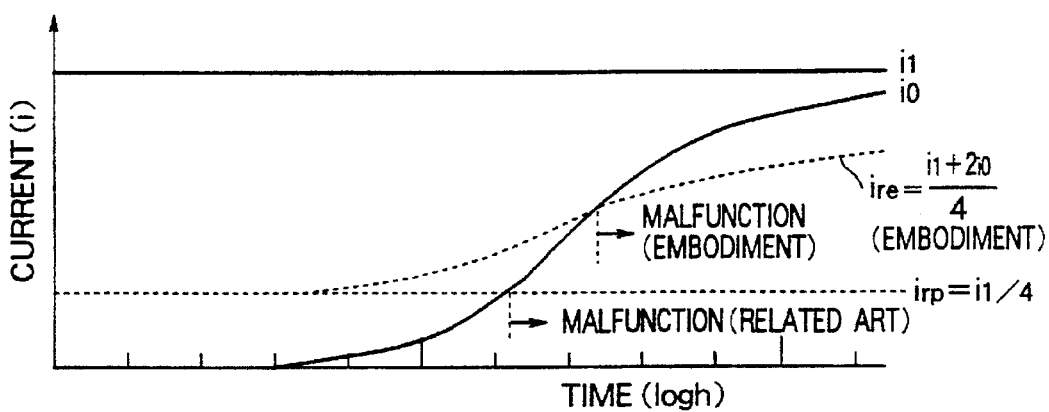
FIG. 2 is a graph showing the change of the memory cell along with the elapse of time and the change of the reference current along with the elapse of time according to one embodiment of the present invention.

For example, where m=1, n=2, and k=4, the change of the reference current $i_{re}$ with respect to the elapse of time can be expressed by the curve $i_{re}$ of FIG. 2. Also, where m=1, n=1, and k=2, the change of the reference current $i_{re}$ with respect to the elapse of time can be expressed by the curve $i_{re}$ of FIG. 5. Namely, the reference current $i_{re}$ also changes in accordance with the change of the data current $i_{re}$ which is read from the memory cell 2 in which the data "0" is stored and tends to be positioned at an intermediate position of the window. As a result, in the differential amplifier 38 shown in FIG. 3, based on the reference current $i_{re}$ which is input to the first input terminal 38a, the "0"/"1" decision of the reading current of the selected memory cell input to the second input terminal 38b can be correctly carried out. Where the reading current of the selected memory cell input to the second input terminal 38b is larger than the reference current $i_{re}$, it can be decided that the data "1" is stored in the memory cell 2. In the reverse case, it can be decided that the data "0" is stored.

Figure 5:
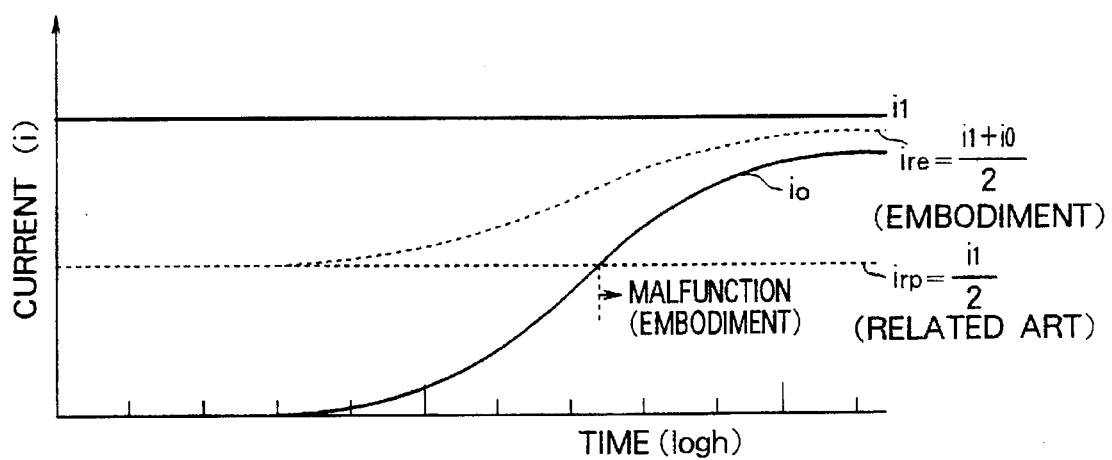
FIG. 5 is a graph for comparing and explaining the change of the memory cell along with the elapse of time and the change of the reference current along with the elapse of time according to a second embodiment of the present invention.

The decision by this differential amplifier 38, as shown in FIG. 2 and FIG. 5, can be continually maintained in accuracy for a long period more than an order greater than conventional devices even if the storage property or the writing property of the memory cell deteriorates along with the elapse of time.

Also, even if there is a manufacturing variation in the memory cells 2, it can be considered that a similar manufacturing variation exists also in the reference cells 16a and 16b. Further, the reference data serving as the reference for the differential amplifier 38 is positioned between windows for the above-mentioned reason, and therefore, as a result, the accuracy of the reading of data will not be degraded.

Note that, the present invention is not restricted to the above-mentioned embodiment and can be modified in various ways within the scope of the present invention.

For example, in the first embodiment, the explanation was made of the case where the electrons are injected into the floating gate for the data "0" and the electrons are discharged from the floating gate for the data "1", but the present invention is not restricted to this. The inverse case to this is also possible.

Figure 6:
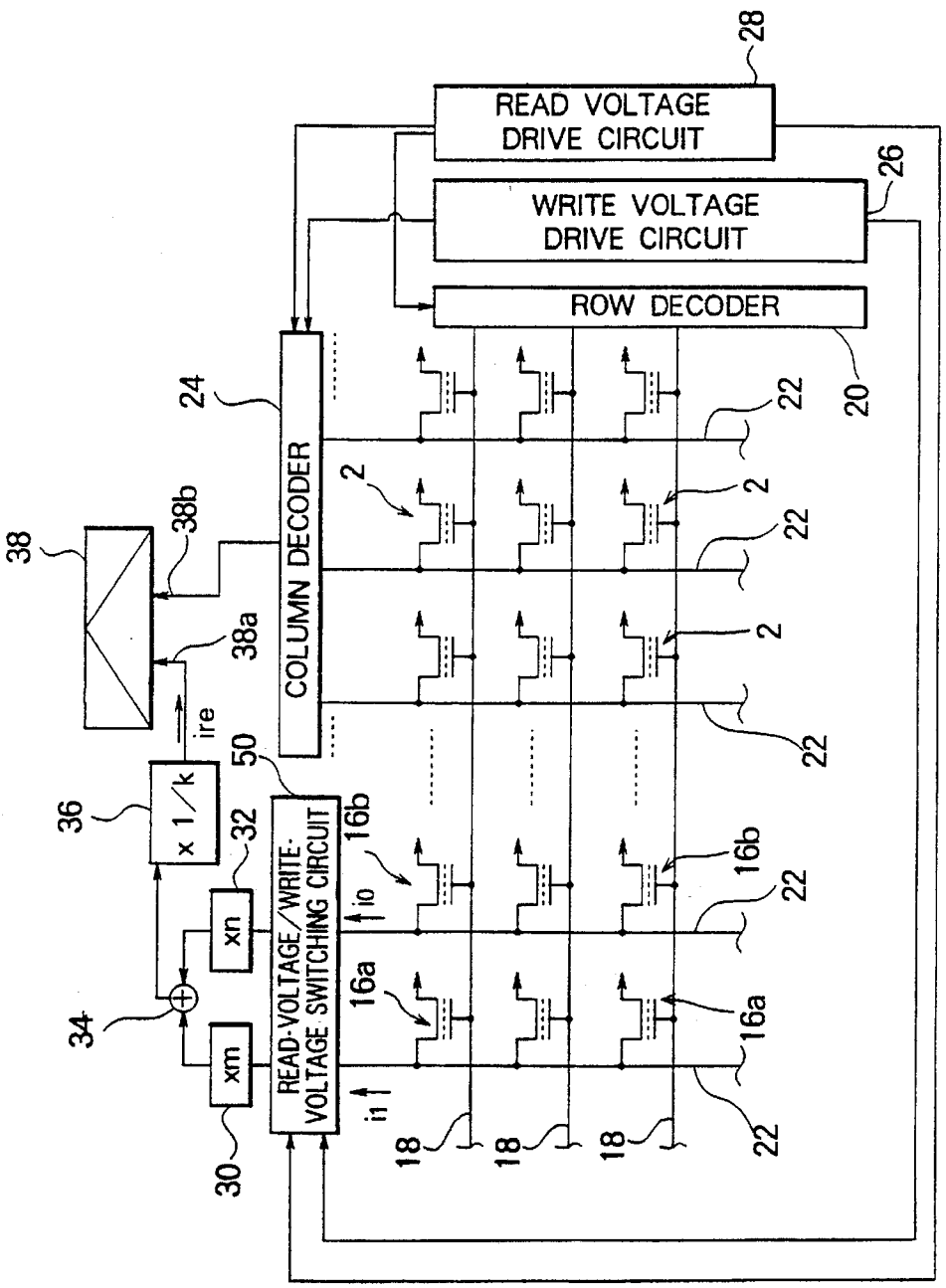
FIG. 6 is a schematic view of the configuration of a nonvolatile semiconductor memory device according to a second embodiment of the present invention.

Further, in the first embodiment shown in FIG. 3, the column decoder 24 of the memory cell 2 was connected to the bit lines 22 of the reference cells 16a and 16b, but it is also possible to constitute the same as shown in FIG. 6. The embodiment shown in FIG. 6 is constituted so that a reading voltage/writing voltage changeover circuit 50 separate from the column decoder is connected to the bit lines 22 of the reference cells 16a and 16b and so that the detection signals from the bit lines 22 go toward the conversion circuits 30 and 32 through this circuit 50. Note that, this changeover circuit 50 is connected to the writing voltage driving circuit 26 and the reading voltage driving circuit 28. The driving voltages from these driving circuits 26 and 28 are changed over by the changeover circuit 50 and applied to the bit lines 22.

Figure 7:
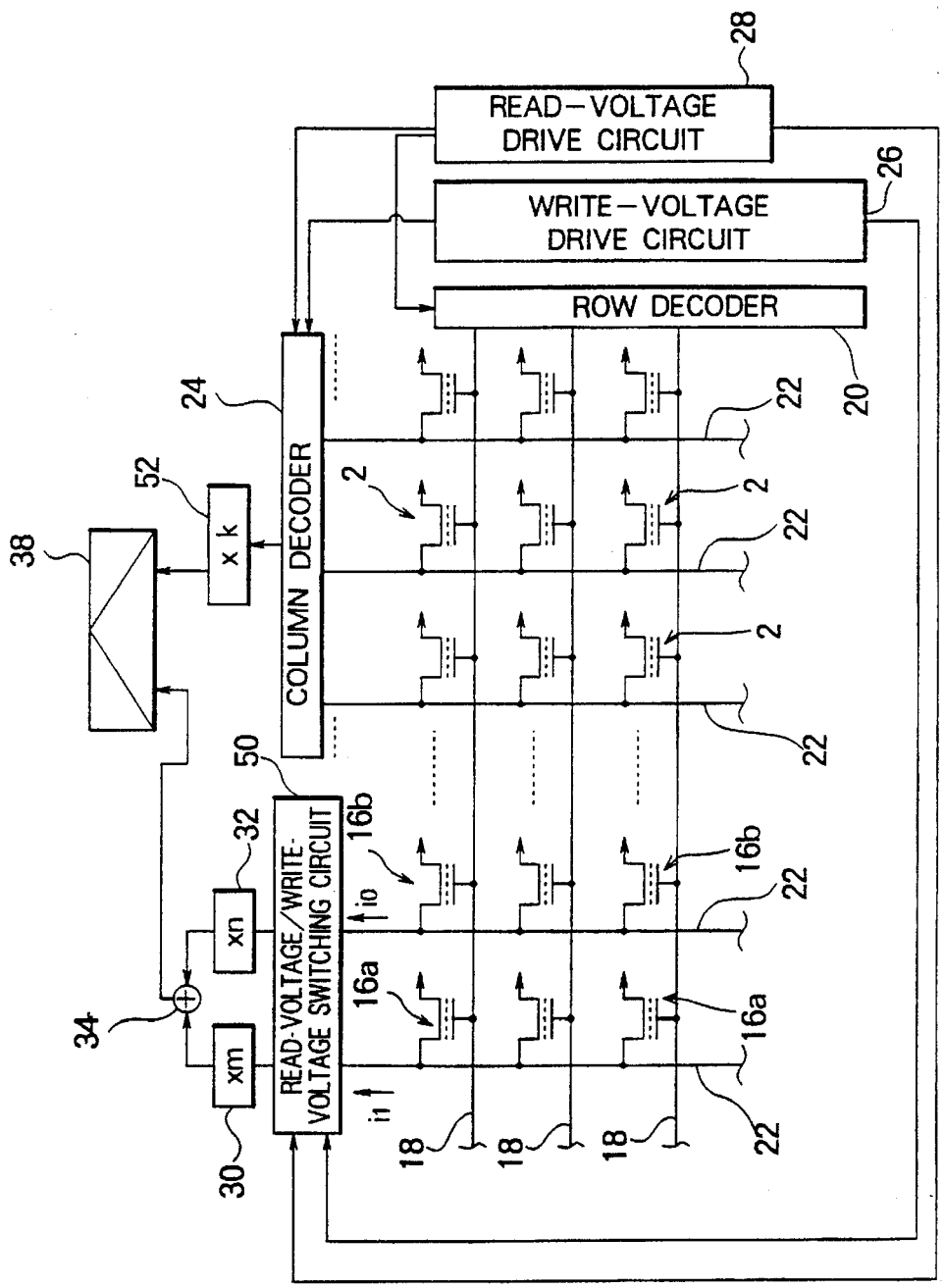
FIG. 7 is a schematic view of the configuration of a nonvolatile semiconductor memory device according to a third embodiment of the present invention.

Also, in the embodiment shown in FIG. 3, the conversion circuit 36 for multiple by 1/k was arranged on the output side of the plus circuit 34, but it is not restricted to this, and as shown in FIG. 7, it is also possible to constitute the memory device so that the conversion circuit 52 multiplying by k is connected to between the column decoder 24 and the differential amplifier 38. In the case of this embodiment, by multiplying the signal data of the selected memory cell by k, the differential amplifier 38 compare the signal data multiplied by k and the output of the plus circuit 34 ($m \times i_1 + n \times i_2$). Accordingly, as a result, in the same way as the embodiment shown in FIG. 3, the signal data of the selected memory cell 2 is compared with the reference data $i_{re} = (m \times i_1 + n \times i_0)/k$.

Also, in the first embodiment shown in FIG. 3, the writing voltage driving circuit 26 and the reading voltage driving circuit 28 were shared by the memory cell 2 and the reference cells 16a and 16b, but it is also possible to separately provide the voltage driving circuits 28 for each of them.

Also, it is not always necessary to drive the memory cell 2 and the reference cells 16a and 16b by the identical word line 18. It is also possible to constitute the memory device so that they are driven at almost the same time by using individual word lines and individual driving circuits.

Also, the arrangement of these driving circuits is not restricted to that of the embodiment shown in FIG. 3. It is also possible to arrange the driving circuits between the reference cells 16a and 16b and the memory cell 2 or at positions other than this.

Figure 8:
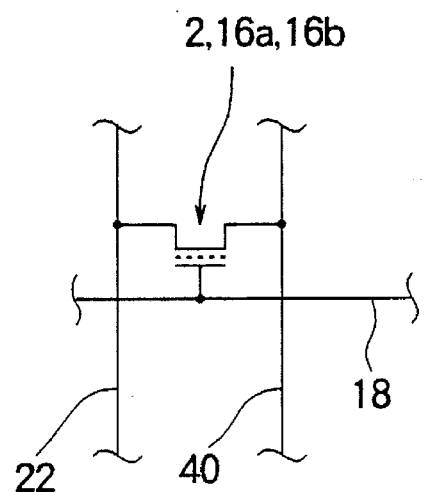
FIG. 8 is a circuit diagram of a memory cell according to the second embodiment of the present invention.
Figure 9:
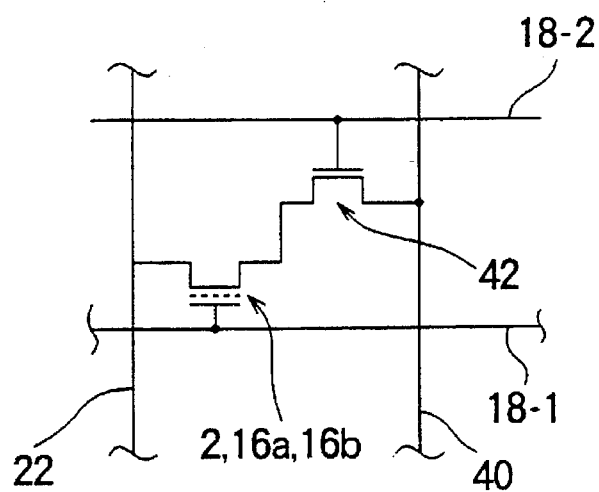
FIG. 9 is a circuit diagram of a memory cell according to the third embodiment of the present invention.

Also, the circuit configuration of the memory cell 2 and the reference cells 16a and 16b is not restricted to the example shown in FIG. 3. As shown in FIG. 8, a type wherein the source line 40 is divided for each of the columns, or as shown in FIG. 9, a type wherein the drain or source of the cell transistors 2, 16a, or 16b is connected to the source line 40 via the selection transistor 42 can be adopted. Note that, preferably, the circuit configurations of the memory cell 2 and the reference cells 16a and 16b are identical.

In the source line division type shown in FIG. 9, where a memory cell constituted by a floating gate type transistor is used, at the time of the erasing, writing, and reading of data, control is exercised so as to give the state of voltage shown in the following Table 2.

TABLE 2

Floating Gate Type Nonvolatile Memory
(NOR Type, Source Line Division)

|  | Word line | Bit line | Source | Substrate or well |
|---|---|---|---|---|
| Erasing | 18 to 20 V | 0 V | Floating | 0 V |
| Writing 1 | −8 V to −20 V | 0 V | 0 V | 0 V |
| Writing 0 | 18 to 20 V | 0 V 8 V (write inhibit) | Floating | 0 V |
| Reading | 1.5 to 3 V | ≃1 V | 0 V | 0 V |

Figure 10:
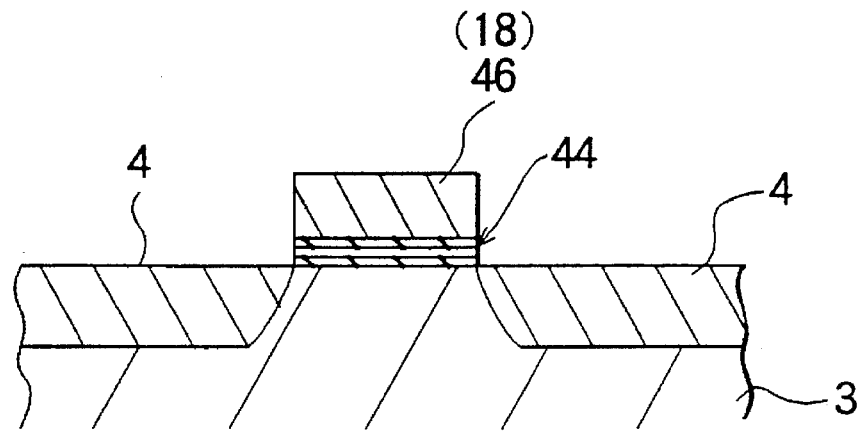
FIG. 10 is a cross-sectional view of a principal part of the memory cell according to the second embodiment of the present invention.

Also, the cell transistors 2, 16a, and 16b are not particularly restricted so far as they are constituted by transistors which can store and erase the charges. As shown in FIG. 10, it is also possible if they are MONOS type cell transistors. In the example shown in FIG. 10, an ONO film 44 is laid on the surface of the semiconductor substrate 3, and a gate electrode 46 is laid on this. The source and drain region 4 is similar to that of the above embodiment. The ONO film 44 is a film having a three-layer structure of $SiO_2/SiN/SiO_2$ and is formed for example by the following method.

First, the surface of the semiconductor substrate 3 is thermally oxidized to form an oxide film of not more that about 2 nm. A silicon nitride film of about 9 nm or less is formed on that thermally oxidized film by the CVD method etc., and the surface thereof is thermally oxidized to form an oxide film of about 4 nm or less. This process forms an ONO film of a three-layer structure. This ONO film has a low leakage current and is excellent in the ability to be controlled in thickness. Also, it is possible to trap electrons in thee silicon nitride film in the ONO film and at the interface between the silicon nitride film and the silicon oxide film. This functions as a memory cell. Also, as a film having a memory function, similarly, also an ON film ($SiO_2/SiN$) and N film (SiN alone ) are known.

The gate electrode 46 is constituted by for example a polycrystalline silicon film or a polysilicide film etc. and acts as the word line 18.

Figure 11:
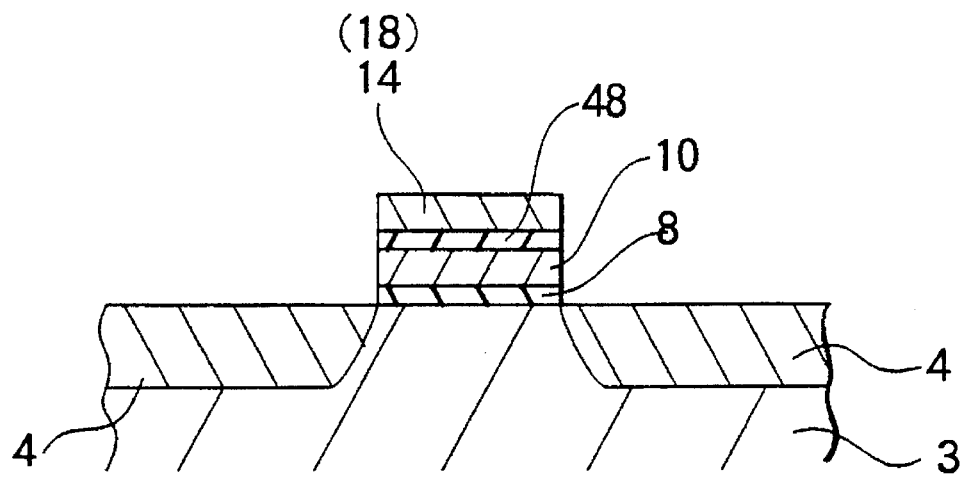
FIG. 11 is a cross-sectional view of a principal part of the memory cell according to the third embodiment of the present invention.

In the example shown in FIG. 11, on the surface of the semiconductor substrate, a floating gate 10, a strong dielectric film 48 having a thickness of about 300 nm such as of PZT, PT ($PbTiO_3$), PLZT, $Y_1$ ($SrBi_2Ta_2O_3$), etc., and a control gate 14 are laid via a gate insulating film 8 having a thickness of about 10 nm. The same reference numerals are given to the same members as those of the example shown in FIG. 4, and an explanation thereof will be omitted. In this example, the memory cell is constituted by utilizing the strong dielectric film 48. Note that, as mentioned before, desirably the memory cell and the reference cell have basically the identical construction in the direction of thickness.

As shown in FIG. 9, in the case of a MONOS type memory cell to which the selection transistor 42 was added, at the time of the erasing, writing, and reading of the data, control is performed so as to give the state of voltage shown in the following Table 3.

TABLE 3

MONOS Type Nonvolatile Memory
(NOR Type, Equipped with Selection Transistor)

|  | Word line 18-1 | Word line 18-2 | Bit line | Source | Substrate or well |
|---|---|---|---|---|---|
| Erasing | 7 to 9 V | 0 V | 0 V | 0 V | 0 V |
| Writing 1 | −7 to −9 V | 0 V | 0 V | 0 V | 0 V |
| Writing 0 | 7 to 9 V | 0 V | 0 V 5 V (write inhibit) | 0 V | 0 V |
| Reading | 0 V | 3 to 5 V | 1 to 1.5 V | 0 V | 0 V |

Next, an explanation will be made of the concrete circuit configuration around a sense amplifier including conversion circuits 30, 32, and 36 (or 52), a plus circuit 34, and the differential amplifier 38 according to FIG. 4, FIG. 6, and FIG. 7 or other examples.

Figure 12:
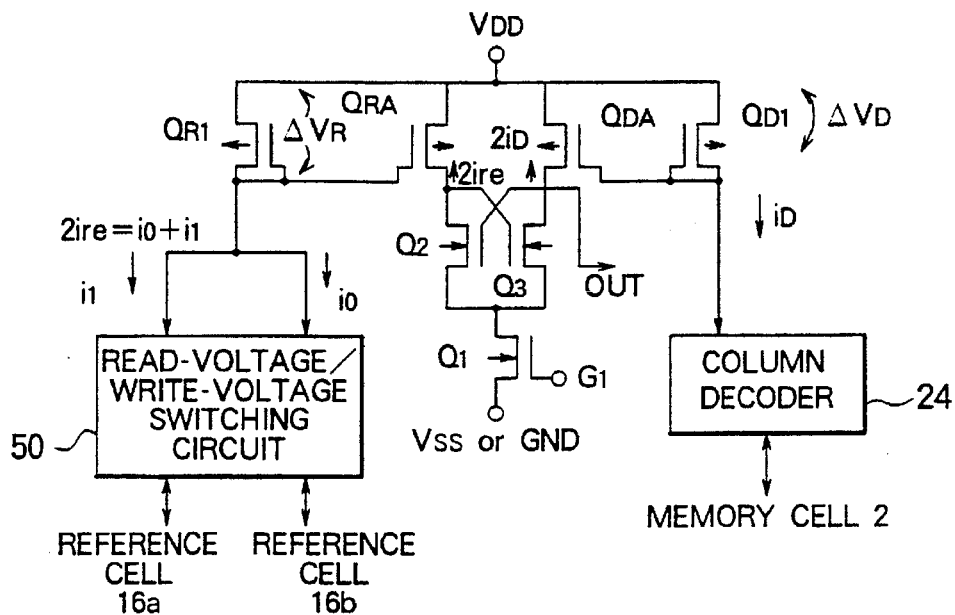
FIG. 12 is a schematic view of the configuration of a nonvolatile semiconductor memory device according to a fourth embodiment of the present invention.

In the embodiment shown in FIG. 12, the transistors $Q_2$, $Q_3$, $Q_{RA}$ and $Q_{DA}$ constitute a differential amplifier circuit having a positive feedback, and the transistor Q1 is the switch of that differential amplifier circuit. Also, the transistor $Q_{R1}$ and an interconnection connecting that transistor $Q_{R1}$ and the reading voltage/writing voltage changeover circuit 50 for a circuit which converts several multiples of the reference current $i_{re}$ based on the Equation (1) to a voltage and inputs the same to the gate of the transistor $Q_{RA}$. Also, the transistor $Q_{D1}$ is a circuit for converting the signal current $i_D$ from the memory cell 2 to a voltage and inputting the same to the gate of the transistor $Q_{DA}$. Note that, the signal current $i_D$ is a value close to $i_0$ where the data stored in the memory cell 2 is the data "0", while is a value close to $i_1$ where the data is the data "1".

In FIG. 12, the transistors $Q_1$, $Q_2$, and $Q_3$ are N-channel type transistors (or P-channel type transistors), and the transistors $Q_{RA}$, $Q_{DA}$, $Q_{R1}$, and $Q_{D1}$ are P-channel type transistors (or N-channel type transistors) reverse from the transistors.

In this embodiment, when the mode is set to the reading mode, the reading voltage is supplied from the voltage source $V_{DD}$. The voltage obtained by subtracting the voltage drop $\Delta VR$ by the transistor $Q_{R1}$ and the voltage drop $\Delta V_{SW}$ at the reading voltage/writing voltage changeover circuit 50 from the source voltage $V_{DD}$ ($V_{DD}-\Delta V_R-\Delta V_{SW}$) is applied to the reference cells 16a and 16b, and the voltage obtained by subtracting the voltage drop $\Delta V_D$ by the transistor $Q_{D1}$ and the voltage drop $\Delta V_{SW}$ at the reading voltage/writing voltage changeover circuit 50 from the source voltage $V_{DD}$ ($V_{DD}-\Delta V_D-\Delta V_{SW}$) is applied to the memory cell 2. Then, the sum of the currents $i_0$ and $i_1$ due to the data stored in reference cells 16a and 16b flows into the transistor $Q_{R1}$.

Where the reference current $i_{re}$ is set to $(i_0+i_1)/2$, the relationship among the transistors $Q_{RA}$, $Q_{DA}$, $Q_{R1}$, and $Q_{D1}$ is set to the relationship as shown in the Case II of the following Table 4A.

TABLE 4A

Case Where $Q_2$ and $Q_3$ Have Identical Dimensional Ratios (W/L Ratios)

|  | Case I | Case II |
| --- | --- | --- |
| Channel width W/channel length L (ratio) of $Q_{RA}$ | Same as $Q_{R1}$ | 1/2 of $Q_{R1}$ |
| W/L (ratio) of $Q_{DA}$ | Two times of $Q_{D1}$ | Same as $Q_{D1}$ |

TABLE 4B

Case Where $Q_{R1}$, $Q_{RA}$, $Q_{D1}$, and $Q_{DA}$ Have Identical Dimensional Ratios (W/L Ratios)

|  | Case I |
| --- | --- |
| W/L ratio of $Q_2$ | Two times of $Q_3$ |

Note that, the transistor $Q_2$ and the transistor $Q_3$ had the same dimensions, but as shown in Table 4B, even in a case where the transistors $Q_{R1}$ and $Q_{RA}$ and the transistors $Q_{D1}$ and $Q_{DA}$ have the same dimensional ratios (W/L ratio), by making the W/L ratio of the transistor $Q_2$ two times that of the transistor $Q_3$, it is also possible to constitute a de facto 1/k circuit. Also at this time, the 1/k circuit ends up being formed integrally with the differential amplifier. Note that, "integral formation" is defined in the present invention as the sharing of the same transistors.

Also, by using the design of the Case I in the above-described Table 4A for the transistors $Q_{RA}$, $Q_{DA}$, $Q_{R1}$, and $Q_{D1}$, ($i_0+i_1$), which is two times the reference current can be compared with two times the signal current. The current value shown in FIG. 12 corresponds to the case of Case I.

In the case of Case II, the 1/k circuit is constituted by a combination of the transistors $Q_{RA}$, and $Q_{R1}$ among the plurality of transistors constituting the differential amplifier, and in the case of Case I, a×k circuit is constituted by the combination of the transistors $Q_{Da}$ and $Q_{D1}$ among the plurality of transistors constituting the differential amplifier. Namely, the 1/k circuit or k circuit is formed integrally with the differential amplifier.

In the differential amplifier, at the time of the reading mode, a ramp voltage input for changing $V_{SS}$ to $V_{DD}$ is applied to the gate $G_1$ of the transistor $Q_1$, the differential amplifier is activated, the reading signal current $i_D$ and the reference current $i_{re}$ or two times the reading signal current $i_D$ and two times the reference current $i_{re}$ are compared, and a decision is made as to if the reading stored in the selected memory cell 2 is the data "1" or "0".

Figure 13:
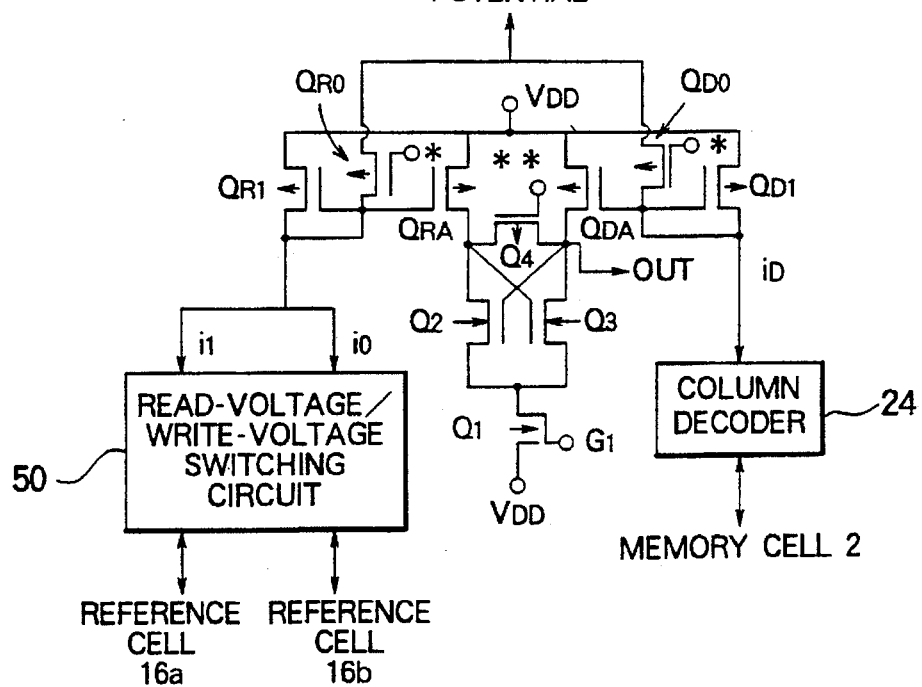
FIG. 13 is a circuit diagram of the sense amplifier according to the second embodiment of the present invention.

So as to stabilize the voltage conversion in the circuit shown in FIG. 12 and, at the time, set an initial state of the differential amplifier circuit and make the same stably operate, a circuit configuration as shown in FIG. 13 can be adopted as well. In the embodiment shown in FIG. 13, the transistors $Q_4$, $Q_{RD}$, and $Q_{DO}$ are added to the circuit shown in FIG. 12 with the connection configuration shown in FIG. 13, whereby the voltage conversion is stabilized and, at the time, the initial state of the differential amplifier circuit can be set and stably operated. The transistors $Q_{RA}$, $Q_2$, and $Q_3$ are N-channel type transistors (or P-channel type transistors), and the transistors $Q_{RA}$, $Q_{DA}$, $Q_{R1}$, $Q_{D1}$, $Q_4$, $Q_{RO}$, and $Q_{DO}$ are P-channel type transistors (or N-channel type transistors) reverse to the transistors. An OFF signal is input to the gate (*) of the transistors $Q_{RO}$ and $Q_{DO}$ at the time of the sense operation. Also, an OFF signal is input to the gate (**) of the transistor $Q_4$ at the time of the sense operation. Note, this OFF signal is input after the OFF signal of the transistors $Q_{RO}$ and $Q_{DO}$.

Figure 14:
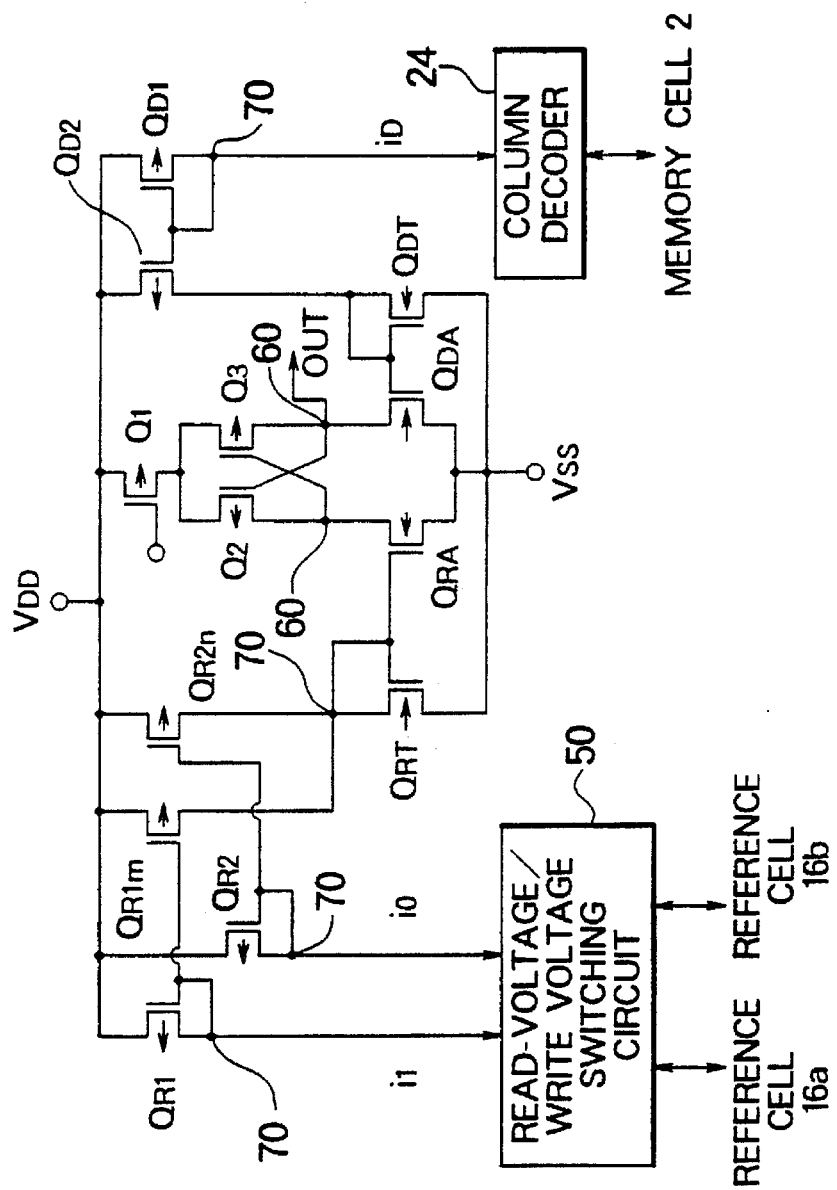
FIG. 14 is a circuit diagram of the sense amplifier according to the third embodiment of the present invention.

FIG. 14 is a circuit diagram of the area around the sense amplifier according to still another embodiment of the present invention. In the embodiment shown in FIG. 14 the transistors $Q_2$, $Q_3$, $Q_{RA}$, and $Q_{DA}$ constitute a differential amplifier circuit having a positive feedback, and the transistor $Q_1$ is a switch of that differential amplifier circuit. The transistors $Q_{R1}$, $Q_{R1m}$, $Q_{R2}$, $Q_{R2n}$, and $Q_{RT}$ shown in FIG. 14 which are connected between the reading voltage/writing voltage conversion circuit 50 and the transistor $Q_{RA}$, of the differential amplifier circuit, and the transistors $Q_{D1}$, $Q_{D2}$, and $Q_{RT}$ shown in FIG. 14 which are connected between the column decoder 24 and the transistor $Q_{DA}$ of the differential amplifier circuit are designed with the relationship shown in the following Table 5.

TABLE 5

|  | Case A | Case B | Case C |
| --- | --- | --- | --- |
| Relationship between W/L ratio of $Q_{R1}$ and W/L ratio of $Q_{R1m}$ | $Q_{R1m}/Q_{R1} = m$ | $Q_{R1m}/Q_{R1} = m/k$ | $Q_{R1m}/Q_{R1} = m$ |
| Relationship between W/L ratio of $Q_{R2}$ and W/L ratio of $Q_{R2n}$ | $Q_{R2n}/Q_{R2} = n$ | $Q_{R2n}/Q_{R2} = n/k$ | $Q_{R2n}/Q_{R2} = n$ |
| Relationship between W/L ratio of $Q_{D1}$ and W/L ratio of $Q_{D2}$ | $Q_{D2}/Q_{D1} = k$ | 1 | 1 |
| Relationship between W/L ratio of $Q_{RT}$ and W/L ratio of $Q_{RA}$ | 1 | 1 | $Q_{RT}/Q_{RA} = k$ |
| Relationship between W/L ratio of $Q_{DT}$ and W/L ratio of $Q_{DA}$ | 1 | 1 | 1 |
|  | Example shown in FIG. 7 | FIG. 3 or FIG. 6 | Example shown in FIG. 3 |

Note that the transistor $Q_2$ and the transistor $Q_3$ have the same dimensions. Also, the transistors $Q_1$, $Q_2$, $Q_3$, $Q_{D1}$, $Q_{D2}$, $Q_{R1}$, $Q_{R1m}$, $Q_{R2}$, and $Q_{R2n}$ are P-channel type transistors (or N-channel type transistors), and the transistors $Q_{RA}$, $Q_{DA}$, $Q_{RT}$, and $Q_{DT}$ are N-channel type transistors (or P-channel type transistors) reverse to the transistors.

When the transistors are designed so that the relationships (Case B and Case C) shown in Table 5 stand, as shown in the above-described Equation (1), the reference current $i_{re}$ becomes $(m \times i_1 + n \times i_0)/k$ and the reference current $i_{re}$ thereof and the signal current $i_D$ of the selected memory cell 2 are consequently compared, while when the transistors are designed to give the relationship of Case A of Table 5, the reference current $i_{re}$ $i_{re}$ becomes $(m \times i_1 - n \times i_0)/k$ and the reference current thereof and the k multiple $(ki_D)$ of the signal current of the selected memory cell 2 are consequently compared and then the decision of whether the data stored in the memory cell 2 is "1" or "0" is carried out.

Note that, in Table 5, the case of Case A shows the concrete circuit configuration of the embodiment shown in FIG. 7, and the case of Case C shows the concrete circuit configuration of the embodiment shown in FIG. 3 or FIG. 6. In the case of Case B, an example of constituting an ×m circuit, ×n circuit, and ×1/k circuit shown in FIG. 3 or FIG. 6 integrally is shown.

The concrete circuit configuration around the sense amplifier according to the present invention is not restricted to the example shown in FIG. 12 to FIG. 14 and can be modified in various ways within the scope of the present invention.

Figure 15:
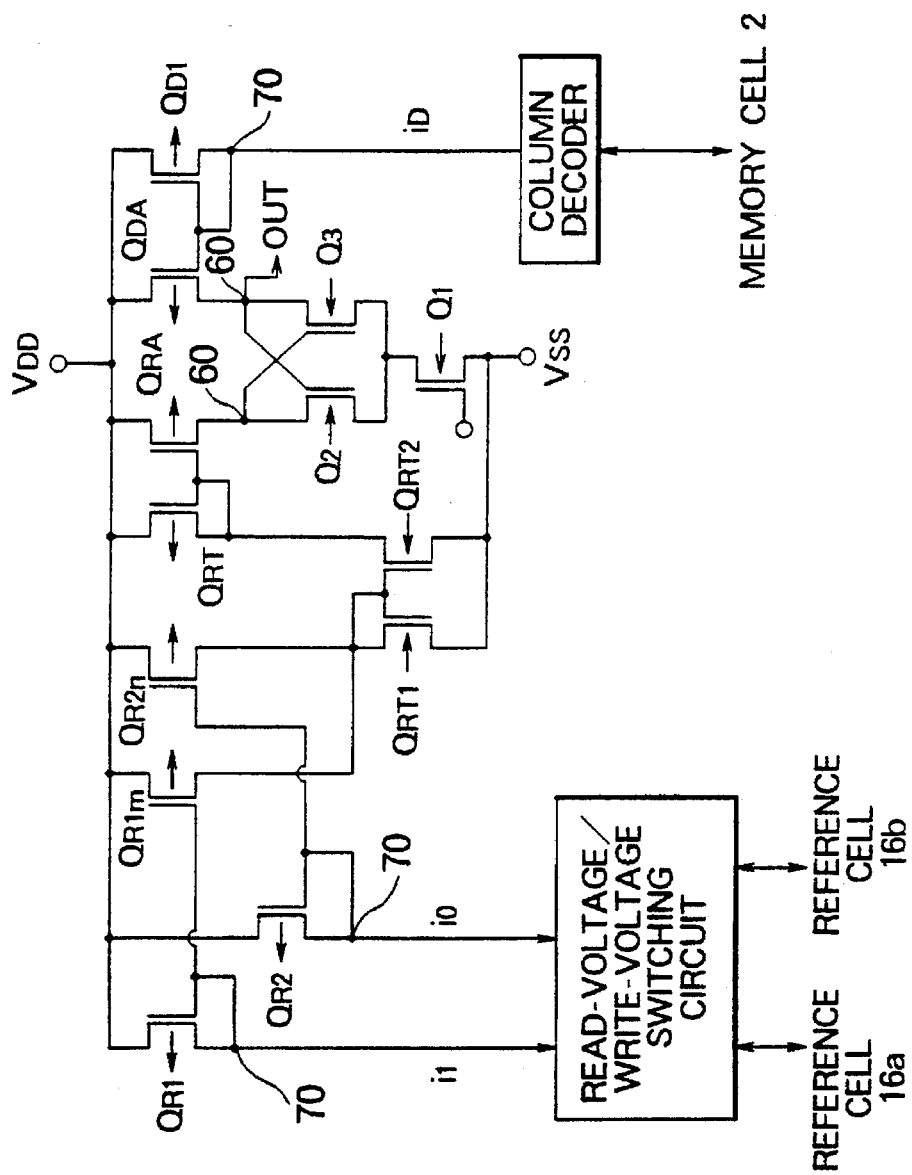
FIG. 15 is a circuit diagram of the sense amplifier according to the fourth embodiment of the present invention.

For example, it can be constituted as shown in FIG. 15.

The embodiment shown in FIG. 15 is a modification of an example shown in FIG. 10, wherein the transistor $Q_1$ which is the switch of the differential amplifier is arranged on the $V_{SS}$ side, the transistors $Q_{D2}$ and $Q_{DT}$ shown in FIG. 10 are abolished, and the transistors $Q_{RT1}$ and $_{RT2}$ are added. The transistors $Q_1$, $Q_2$, $Q_3$, $Q_{RT1}$, and $Q_{RT2}$ are N-channel type transistors (or P-channel type transistors), and the transistors $Q_{RA}$, $Q_{DA}$, $Q_{RT}$, $Q_{D1}$, $Q_{R1}$, $Q_{R1m}$, $Q_{R2}$, and $Q_{R2n}$ are P-channel type transistors ,(or N-channel type transistors) reverse to the transistors.

In the present embodiment, in the Table 5, the transistor $Q_{D2}$ is replaced by the transistor $Q_{DA}$ shown in FIG. 15, and the column of the W/L ratio of $Q_{DT}$ and W/L ratio of $Q_{DA}$ is eliminated, whereby a similar design to the embodiment shown in FIG. 14 is possible. Note that, the transistors $Q_{RT1}$ and $Q_{RT2}$ have the same dimensions, and also the transistors $Q_2$ and $Q_3$ have the same dimensions. Further, as another embodiment thereof, the transistors $Q_4$ and $Q_{R0}$ and $Q_{D0}$ of the embodiment shown in FIG. 13 are respectively added to the positions indicated by the symbols 60 and 70 of the circuit of the embodiment shown in FIGS. 14 and 15, whereby the voltage conversion is stabilized and, at the time, the initial state of the differential amplifier can be set and a stable operation can be carried out.

Note that, in the above-mentioned embodiments, the explanation was made of a NOR type memory, but the present invention is not restricted to this and can be applied also with respect to a NAND type.

What is claim is:

1. A nonvolatile semiconductor memory device, comprising:

a plurality of memory cells having transistors which are electrically and reversibly variable in threshold voltages;

at least one pair of reference cells, provided for each predetermined number of memory cells, having transistors which have a construction in a direction of thickness roughly the same as that in a direction of thickness of the transistors constituting said memory cells;

a driving means for writing and for also driving the at least one pair of reference cells when driving a selected memory cell and writing a first data in one reference cell and writing a second data inverted in phase from the first data in the other reference cell at the time of writing in the selected memory cell;

a driving means for reading a data of the at least one pair of reference cells when reading a data of the selected memory cell;

a reference current production means for combining a current:$i_1$ of the one reference cell corresponding to the first data and a current:$i_0$ of the other reference cell corresponding to the second data in the at least one pair of reference cells based on the following Equation (1) and preparing a k-multiple of a reference current:$i_{re}$, or the reference current:$i_{re}$ $$i_{re} = (m \times i_1 + n \times i_0)/k \tag{1}$$

where m, n, and k are positive numbers, and both of m and n are smaller than k; and a comparison means for determining a data stored in the selected memory cell by comparing the reference current: $i_{re}$ or the k-multiple of the reference current:$i_{re}$ produced by said production means with a current flowing in the selected memory cell or the k multiple of the current flowing in the selected memory cell.

2. A nonvolatile semiconductor memory device as set forth in claim 1, wherein said each predetermined number of memory cells and said at least one pair of reference cells are connected by an identical word line.

3. A nonvolatile semiconductor memory device as set forth in claim 1, wherein the transistors constituting said memory cells and the transistors constituting the reference cells are transistors having a floating gate which can store a charge, having an insulating film able to trap a charge, and having a strong dielectric film.

4. A nonvolatile semiconductor memory device as set forth in claim 1, wherein said comparison means comprises at least a differential amplifier as part of constituent elements of said comparison means and due to said reference current production means and said comparison means, a transistor constituting a part of said reference current production means acts also as a transistor of a part of the differential amplifier constituting said comparison means.

5. A nonvolatile semiconductor memory device as set forth in claim 4, comprising:

a first current-to-voltage conversion transistor which converts to a voltage from a signal current of a joined interconnection at which output lines of said at least one pair of reference cells are joined and connected;

a first transistor for the differential amplifier to which an output line of said first current-to-voltage conversion transistor is connected and which constitutes the transistor of the part of said differential amplifier;

a second current-to-voltage conversion transistor which converts to a voltage from a signal current of an output line of said selected memory cell; and a second transistor for the differential amplifier to which an output line of said second current-to-voltage conversion transistor is connected and which constitutes the transistor of the part of said differential amplifier, wherein a mutual relationship exists among values obtained by dividing a channel width in said first current-to-voltage conversion transistor, said second current-to-voltage conversion transistor, said first transistor for the differential amplifier, and said second transistor for the differential amplifier by a channel length being set to a predetermined ratio.

6. A nonvolatile semiconductor memory device as set forth in claim 4, comprising:

a first coefficient multiple conversion circuit for multiplying a signal current of an output line of said one reference cell by m or m/k;

a second coefficient multiple conversion circuit for multiplying a signal current of an output line of said other reference cell by n or n/k;

a joined interconnection circuit which joins an output line of said first coefficient multiple conversion circuit and an output line of said second coefficient multiple conversion circuit;

a first current-to-voltage conversion transistor which converts to a voltage from a current flowing through the joined interconnection circuit;

a first transistor for the differential amplifier to which an output line of said first current-to-voltage conversion transistor is connected and which constitutes the transistor of the part of said differential amplifier;

a third coefficient multiple conversion circuit which multiplies a signal current of an output line of said selected memory cell by k or l;

a second current-to-voltage conversion transistor which converts to a voltage from a signal current of an output line of the third coefficient multiple conversion circuit; and a second transistor for the differential amplifier to which an output line of said second current-to-voltage conversion transistor is connected and which constitutes the transistor of the part of said differential amplifier, wherein a mutual relationship exists among values obtained by dividing a channel width in a transistor of the first coefficient multiple conversion circuit, a transistor of the second coefficient multiple conversion circuit, a transistor of the third coefficient multiple conversion circuit, the first current-to-voltage conversion transistor, the second current-to-voltage conversion transistor, the first transistor for the differential amplifier, and the second transistor for the differential amplifier by a channel length being set to a predetermined ratio.

7. A nonvolatile semiconductor memory device as set forth in claim 4, comprising:

a first coefficient multiple conversion circuit for multiplying a signal current of an output line of said one reference cell by m or m/k;

a second coefficient multiple conversion circuit for multiplying a signal current of an output line of said other reference cell by n or n/k;

a joined interconnection circuit which joins an output line of said first coefficient multiple conversion circuit and an output line of the second coefficient multiple conversion circuit;

a first current-to-voltage conversion transistor which converts a current flowing through the joined interconnection circuit to a voltage;

a first transistor for the differential amplifier to which an output line of said first current-to-voltage conversion transistor is connected and which constitutes the transistor of the part of said differential amplifier;

a second current-to-voltage conversion transistor which converts a signal current of an output line of said selected memory cell to a voltage; and a second transistor for the differential amplifier to which an output line of said second current-to-voltage conversion transistor is connected and which constitutes the transistor of the part of said differential amplifier, wherein a mutual relationship exists among values obtained by dividing a channel width in a transistor of the first coefficient multiple conversion circuit, a transistor of the second coefficient multiple conversion circuit, the first current-to-voltage conversion transistor, the second current-to-voltage conversion transistor, the first transistor for the differential amplifier, and the second transistor for the differential amplifier by a channel length being set to a predetermined ratio.

* * * * *